(12) United States Patent
Buell

(10) Patent No.: US 9,236,873 B1
(45) Date of Patent: Jan. 12, 2016

(54) FRACTIONAL DIVIDER BASED PHASE LOCKED LOOPS WITH DIGITAL NOISE CANCELLATION

(71) Applicant: Integrated Device Technology, Inc., San Jose, CA (US)

(72) Inventor: Brian Buell, Gilbert, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 14/573,146

(22) Filed: Dec. 17, 2014

(51) Int. Cl.
H03L 7/06 (2006.01)
H03L 7/099 (2006.01)
H03L 7/093 (2006.01)

(52) U.S. Cl.
CPC .............. *H03L 7/0992* (2013.01); *H03L 7/093* (2013.01)

(58) Field of Classification Search
None
See application file for complete search history.

(56) References Cited

U.S. PATENT DOCUMENTS

| | | | |
|---|---|---|---|
| 4,686,488 A | 8/1987 | Attenborough | |
| 5,079,521 A | 1/1992 | Gaskell et al. | |
| 6,064,272 A | 5/2000 | Rhee | |
| 6,353,649 B1 | 3/2002 | Bockleman et al. | |
| 6,621,317 B2 | 9/2003 | Saeki | |
| RE40,424 E | 7/2008 | Han et al. | |
| 7,417,510 B2 | 8/2008 | Huang | |
| 7,450,680 B2 | 11/2008 | Mar | |
| 7,532,081 B2 | 5/2009 | Partridge et al. | |
| 7,593,496 B2 | 9/2009 | Fan et al. | |
| 7,724,097 B2 | 5/2010 | Carley et al. | |
| 7,969,251 B2 | 6/2011 | Fu et al. | |
| 8,248,175 B2 | 8/2012 | Hara | |
| 8,384,452 B1* | 2/2013 | Parker et al. | ................... 327/156 |
| 8,441,291 B2 | 5/2013 | Hara et al. | |
| 8,559,587 B1 | 10/2013 | Buell et al. | |
| 8,674,731 B1* | 3/2014 | Hellmer et al. | ................ 327/156 |
| 8,692,599 B2 | 4/2014 | Gong et al. | |
| 2003/0048863 A1 | 3/2003 | Saeki | |
| 2004/0211819 A1 | 10/2004 | Ezumi et al. | |
| 2005/0094757 A1 | 5/2005 | Meninger et al. | |
| 2007/0211819 A1* | 9/2007 | Greenberg | ..................... 375/295 |
| 2011/0095830 A1 | 4/2011 | Tsangaropoulos et al. | |

(Continued)

OTHER PUBLICATIONS

Efstathiou, Dimitrios, "A Digital Loop Filter for a Phase Locked Loop", 17th International Conference on Digital Signal Processing (DSP), 2011, © 2011 IEEE, pp. 1-6.

(Continued)

*Primary Examiner* — Cassandra Cox
(74) *Attorney, Agent, or Firm* — Myers, Bigel, et al.

(57) ABSTRACT

A PLL includes a fractional divider to generate a periodic PLL output signal in response to $REF_{HF}$. The fractional divider includes a digital control circuit (DDC) responsive to a digital control input signal and a multi-modulus divider (MMD), which is responsive to $REF_{HF}$ and a first digital control output signal generated by the DDC. A feedback divider (FD) is provided to generate a FD output signal in response to an MMD output signal generated by the MMD. A phase detector (PD) is provided to generate a PD output signal in response to the FD output signal and REF_CLK. A loop filter is provided to generate the digital control input signal in response to the PD output signal as modified by a noise cancellation signal (NCS). The NCS is generated to at least partially compensate for non-random deterministic noise in the MMD output signal.

20 Claims, 7 Drawing Sheets

(56) References Cited

U.S. PATENT DOCUMENTS

2013/0076415 A1* 3/2013 Hara et al. .................. 327/159
2013/0229212 A1* 9/2013 Dunworth et al. ............ 327/156

OTHER PUBLICATIONS

Floyd, Brian A., "Sub-Integer Frequency Synthesis Using Phase-Rotating Frequency Dividers", IEEE Transactions on Circuits and Systems—I: Regular Papers, vol. 55, No. 7, Aug. 2008, pp. 1823-1833.

$I^2C$—Programmable Any-Frequency, Any-Output Quad Clock Generator—Si5338, Silicon Labs, Rev.1.0 1/11, Copyright © 2011 by Silicon Laboratories, 42 pages.

Li Zhang et al., entitled "A Hybrid Spur Compensation Technique for Finite-Modulo Fractional-N Phase-Locked Loops", IEEE Journal of Solid-State Circuits, vol. 44, No. 11, pp. 2922-2934, Nov. 2009.

Rohde, Ulrich L., Synthesizer Design for Microwave Application, Department of Electrical Engineering, Universities of Oradea, Bradford, and George Washington, Copyright © 1999, by Ulrich L. Rohde—p. 1 of 51.

S. Pamarti et al., entitled "A Spur Elimination Technique for Phase Interpolation-Based Fractional-N PLLs", IEEE Trans. on Circuits and Systems, vol. 55, No. 6, pp. 1639-1647, Jul. 2008.

Shu et al., CMOS PLL Synthesizers: Analysis and Design, Chapter 2, Springer Science+Business Media, 2005, pp. 16-19.

* cited by examiner

FRACTIONAL DIVIDER BASED PHASE LOCKED LOOPS WITH DIGITAL NOISE CANCELLATION

FIELD

The present invention relates to frequency synthesizer circuits and, more particularly, to frequency synthesizer circuits that perform fractional division of high frequency reference signals.

BACKGROUND

Fractional-N frequency synthesizers can be used to overcome many limitations associated with integer-N frequency synthesizers. In fractional-N frequency synthesizers, the effective frequency divide ratio is a fractional number, which enables a relatively high frequency reference signal to be used to achieve fine resolution of frequencies in synthesizer output signals. This fractional number is typically achieved by periodically changing an integer divide ratio so that a desired fractional number can be approximated. One typical disadvantage associated with fractional-N frequency synthesis is the generation of unwanted low-frequency "spurs" by a dual-modulus (or multi-modulus) divider. These spurs make fractional-N frequency synthesizers impractical for many applications unless they are suppressed to a negligible level. Conventional spur reduction techniques include: (i) digital-to-analog (DAC) phase estimation, (ii) random jittering, which randomizes a divide ratio, (iii) sigma-delta (ΣΔ) noise shaping, which modulates a divide ratio, (iv) phase interpolation; and (v) pulse generation. Some of these spur reduction techniques are disclosed in articles by: S. Pamarti et al., entitled "A Spur Elimination Technique for Phase Interpolation-Based Fractional-N PLLs", IEEE Trans. on Circuits and Systems, Vol. 55, No. 6, pp. 1639-1647, July (2008); and Li Zhang et al., entitled "A Hybrid Spur Compensation Technique for Finite-Modulo Fractional-N Phase-Locked Loops", IEEE Journal of Solid-State Circuits, Vol. 44, No. 11, pp. 2922-2934, November (2009).

As illustrated by FIG. 1A, a frequency synthesizer 10 may include a fractional-N divider 12 within a feedback path of a phase-locked loop (PLL), which filters jitter in the output of the divider 12. This fractional-N divider 12 may operate by modulating between two or more integer values. The phase-locked loop of FIG. 1A contains a phase detector 14, which receives an input reference signal (e.g., 25 MHz), a charge pump 16, a loop filter 18 and a voltage-controlled oscillator (VCO) 20. This VCO 20 generates an output signal having a frequency that is a non-integer multiple of the frequency of the input reference signal. An integer divider 22 may also be provided for generating an output signal at a reduced frequency relative to the VCO output signal. Examples of the frequency synthesizer 10 of FIG. 1A are disclosed at U.S. Pat. No. 7,532,081 to Partridge et al., entitled "Frequency and/or Phase Compensated Microelectromechanical Oscillator," and FIG. 3 of U.S. Pat. No. 7,417,510 to Huang, entitled "Direct Digital Interpolative Synthesis".

FIG. 1B illustrates a frequency synthesizer 10', which includes an integer divider 12' within a feedback path of a phase-locked loop (PLL). This phase-locked loop contains a phase detector 14, which receives an input reference signal (e.g., 25 MHz), a charge pump 16, a loop filter 18 and a voltage-controlled oscillator (VCO) 20, which generates an output signal having a frequency that is an integer multiple of the frequency of the input reference signal. Multiple fractional-N dividers 22a-22d may be provided for generating output signals having different frequencies, which do not have integer relationships with the output frequency of the VCO 20. As will be understood by those skilled in the art, additional circuitry may be needed to reduce jitter in the signals generated by the dividers 22a-22d. The dividers 22a-22d may be provided as interpolative dividers as disclosed at FIGS. 4-6 of the '510 patent to Huang. For example, as shown by FIG. 5 of Huang, an interpolative divider can include a fractional-N divider, which receives a VCO clock. A first order delta sigma modulator receives a digital divide ratio (M/N). The integer portion of the digital divide ratio is supplied to the fractional-N divider as a divide control signal, which can be a stream of integers that approximate the fractional divide ratio. A digital quantization error, which corresponds to the fractional portion of the divide ratio, is supplied to a digitally controlled phase interpolator. The jitter introduced by the fractional-N divider can be canceled by interpolation in the phase interpolator, which is based on the digital quantization error supplied by the delta sigma modulator. In this manner, the input clock from the VCO is first divided down by the fractional-N divider according to the control information provided by the delta sigma modulator and then the phase interpolator operates to cancel quantization errors in the output of the fractional-N divider.

Additional examples of fractional-N frequency synthesizers, which utilize an accumulator within a numerically-controlled oscillator and a phase interpolator, are disclosed at FIG. 6 of the '510 patent to Huang and in U.S. Pat. No. 7,724,097 to Carley et al., entitled "Direct Digital Synthesizer for Reference Frequency Generation." Digitally-controlled oscillators containing interpolative dividers are also disclosed in U.S. Pat. No. 8,441,291 to Hara et al., entitled "PLL Using Interpolative Divider as Digitally Controlled Oscillator," and U.S. Pat. No. 8,248,175 to Hara, entitled "Oscillator with External Voltage Control and Interpolative Divider in the Output Path."

Still further examples of fractional-N frequency synthesizers are disclosed in commonly assigned U.S. Pat. No. 8,559,587 to Buell et al., entitled "Fractional-N Dividers Having Divider Modulation Circuits Therein with Segmented Accumulators," the disclosure of which is hereby incorporated herein by reference. In particular, in FIGS. 2A-2B of the '587 patent, a fractional-N divider circuit 100 is illustrated as including a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104, which is shown as the divider modulation circuit 104a and the phase error calculator 104b. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit and phase error calculator 104 of FIG. 2A includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, ..., MSB) of a digital code and corresponding segment overflow signals. The segments 106a-106n may be synchronized with a clock signal, which is shown as a signal ($f_1$) generated by the divider 102. For example, a relatively wide 16-bit segmented accumulator, which is typically needed for high resolution, may be defined by a cascaded arrangement of four 4-bit accumulator segments. The segmented accumulator 106 may provide advantages over typical accumulators within conventional delta-sigma modulators because the per cycle delay through the divider modulation circuit 104a is equivalent to the delay through a single segment (106a, . . . , 106n) of the accumulator 106, which may need to run at twice a frequency of an output signal (e.g., $F_{OUT}$). In this manner, the segments of the accumulator 106 operate collectively as an adder with at least one cycle (and typically many cycles) of latency. This segmented "adder" does not generate accurate counts with each clock signal, but ultimately yields a correct, albeit delayed, sequence of final overflow signals (from segment 106n) at a potentially much higher frequency rate. As further illustrated by FIG. 2A, the phase error calculator 104b includes a segment (e.g., four-bit) delay block 105a that compensates for the latency between the accumulator segment values associated with segments 106n-1 and 106n. An additional accumulator segment 107 and delay block 105b, which are optional, may be used within the phase error calculator 104b to produce a delta-sigma modulated signal that represents the value in the lower accumulator segments that do not directly feed a phase correction circuit 110.

This phase correction circuit 110 is configured to generate a second reference signal ($F_{OUT}$) in response to the divider output signal ($f_1$) generated by the multi-modulus divider 102. The phase correction circuit 110 includes a D-type flip-flop 112, which has a data terminal responsive to the second reference signal $F_{OUT}$ and a synchronization terminal responsive to the divider output signal and a pulse-width locked loop 114. This pulse-width locked loop 114 may include, among other things, an analog phase interpolator and a digital phase selection circuit, as shown by FIG. 2B.

The phase correction circuit 110 is illustrated as including a pulse-width locked loop 114 that utilizes a delay line containing a plurality of voltage-controlled delay cells 116a-116e to achieve a delay of one VCO period and an additional VCO cell 116f to provide equivalent loading. The pulse-width locked loop 114 further includes an XOR gate 118, which operates as a pulse generator to generate a pulse having a width of four delay blocks from the delay line, a charge pump 120 and capacitive loop filter $C_L$. As shown by the four inputs to each of the pair of multiplexers 122a-122b, digital phase selection in fine steps of $T_{VCO}/4$ can be achieved with analog phase interpolation being performed between these finer steps by an output multiplexer 124. This configuration yields two (2) bits of resolution allocated to the multiplexers and additional bits of resolution in the analog phase interpolator. Although not wishing to be bound by any theory, because the edges of the signals provided to the phase interpolator are closely spaced, they typically do not need to be filtered. The close spacing may also yield greater linearity and preclude any need for trimming.

Referring now to FIG. 3, another conventional fractional-N divider circuit 100' is shown as including a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit 104a includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, . . . , MSB) of a digital code and corresponding segment overflow signals. The phase error calculator 104b includes a plurality of delay elements 105a-150b and an additional accumulator segment 107, which collectively generate multiple bits of a digital phase error that is provided to a phase correction circuit 110'. The accumulator segments 106a-106n and 107 are synchronized with a high frequency clock signal, which may be generated by a frequency multiplier 109.

This phase correction circuit 110' is configured to generate a second reference signal ($F_{OUT}$) in response to a divider output signal ($f_1$) generated by the multi-modulus divider 102. The phase correction circuit 110' is configured so that the second reference signal ($F_{OUT}$) has a substantially jitter-free and uniform duty cycle. The phase correction circuit 110' is illustrated as including a pair of latches (e.g., D-type flip-flops) 112a-112b, which have data terminals responsive to the second reference signal $F_{OUT}$ and synchronization terminals (e.g., clock terminals) responsive to true and complementary versions of the divider output signal $f_1$, which operates as a duty cycle adjustment circuit, and an analog phase interpolator 114'. This phase interpolator 114' may be configured as an analog multiplexer, which combines two edges of the signals generated by the flip-flops 112a-112b that are separate by one VCO period. Programmable filters 117a-117c are also provided for adjusting the edge rates of the input and output signals and, therefore, the linearity of the analog phase interpolator 114'.

SUMMARY OF THE INVENTION

Fractional divider based phase-locked loops (FDPLLs) according to some embodiments of the invention include a fractional divider configured to generate a periodic PLL output signal in response to a first periodic reference signal ($REF_{HF}$). The fractional divider includes a digital control circuit responsive to a digital control input signal and a multi-modulus divider (MMD), which is responsive to the first periodic reference signal and a first digital control output signal generated by the digital control circuit. A feedback divider (FD) is provided, which is configured to generate a periodic FD output signal in response to a periodic MMD output signal generated by the MMD. A digital phase detector (PD) is provided, which is configured to generate a PD output signal in response to the FD output signal and a second periodic reference signal (REF_CLK). A digital loop filter is provided, which is configured to generate the digital control input signal in response to the phase detector output signal as modified by a noise cancellation signal, which is generated by the digital control circuit. This noise cancellation signal is generated to at least partially compensate for non-random deterministic noise in the MMD output signal, which may be a relatively noisy signal relative to the PLL output signal.

According to still further embodiments of the invention, the first digital control output signal is synchronized to the MMD output signal and the noise cancellation signal is synchronized to the FD output signal, which has a lower frequency relative to the MMD output signal. In some of these embodiments, the fractional divider includes a phase interpolator, which is responsive to a second digital control output signal generated by the digital control circuit. This second digital control output signal may also be synchronized to the MMD output signal.

According to still further embodiments of the invention, the digital control circuit includes a register having a data input responsive to (at least) the second digital control output signal and the noise cancellation signal is derived from a digital signal generated at an output of the register. This register may utilize the FD output signal as a clock signal that synchronizes the frequency at which the noise cancellation signal is updated.

According to still further embodiments of the invention, a phase-locked loop (PLL) integrated circuit includes a fractional divider configured to generate a periodic PLL output signal in response to a first periodic reference signal ($REF_{HF}$). The fractional divider includes: (i) a digital control circuit, which is responsive to a digital control input signal, (ii) a multi-modulus divider (MMD), which is responsive to the first periodic reference signal and a first digital control output signal generated by the digital control circuit; and (iii) an analog phase interpolator responsive to a second digital control output signal generated by the digital control circuit. A feedback divider (FD) is also provided, which is configured to generate a periodic FD output signal in response to a periodic MMD output signal generated by the MMD. A digital phase detector (PD) is provided, which is configured to generate a PD output signal in response to the FD output signal and a second periodic reference signal. A digital loop filter is provided, which is configured to generate the digital control input signal in response to the phase detector output signal, as modified by a digital noise cancellation signal that varies in response to changes in the second digital control output signal. According to some embodiments of the invention, the noise cancellation signal can be an M-bit digital signal and the second digital control output signal can be an N-bit digital signal, where M and N are positive integers greater than four (4) and M is greater than N. In addition, changes in the second digital control output signal can be synchronized to the MMD output signal. In particular, the digital control circuit may include an accumulator that is synchronized to the MMD output signal and generates the second digital control output signal at an output thereof. The MMD output signal is typically "noisier" than the PLL output signal. Nonetheless, the noise in the MMD output signal may be treated as non-random deterministic digital noise that can be corrected/cancelled at the output of the digital phase detector and before the digital loop filter.

DETAILED DESCRIPTION OF EMBODIMENTS

Figure 1A:
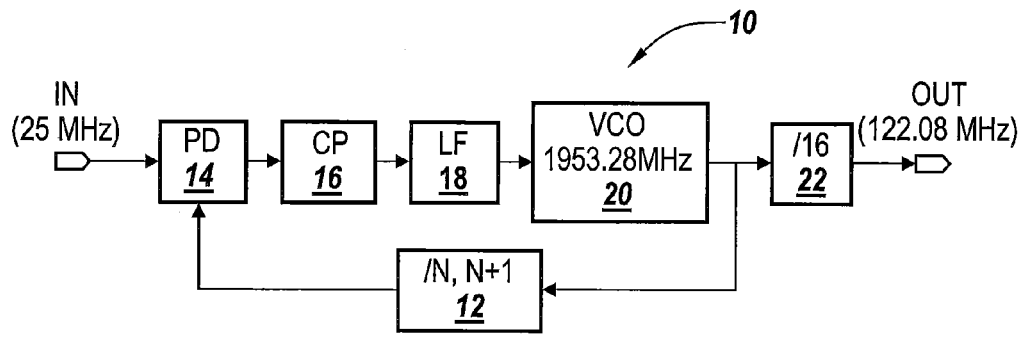
FIG. 1A is a block diagram of a frequency synthesizer that utilizes a fractional-N divider within a feedback path of a phase-locked loop (PLL), according to the prior art.
Figure 1B:
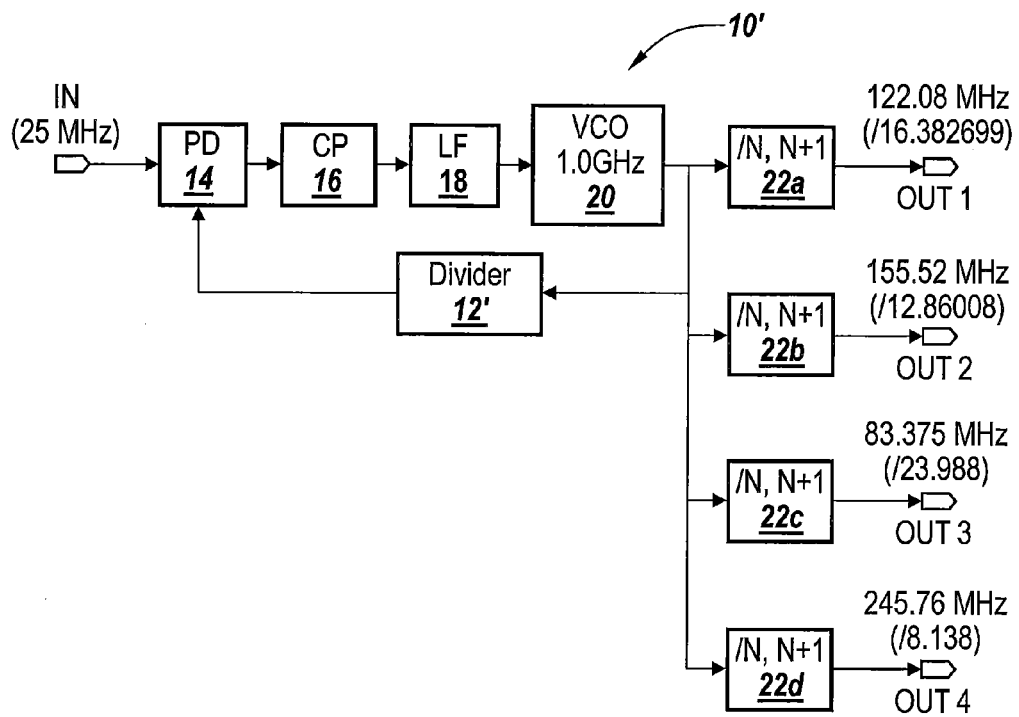
FIG. 1B illustrates a frequency synthesizer that utilizes an integer divider within a feedback path of a phase-locked loop (PLL), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
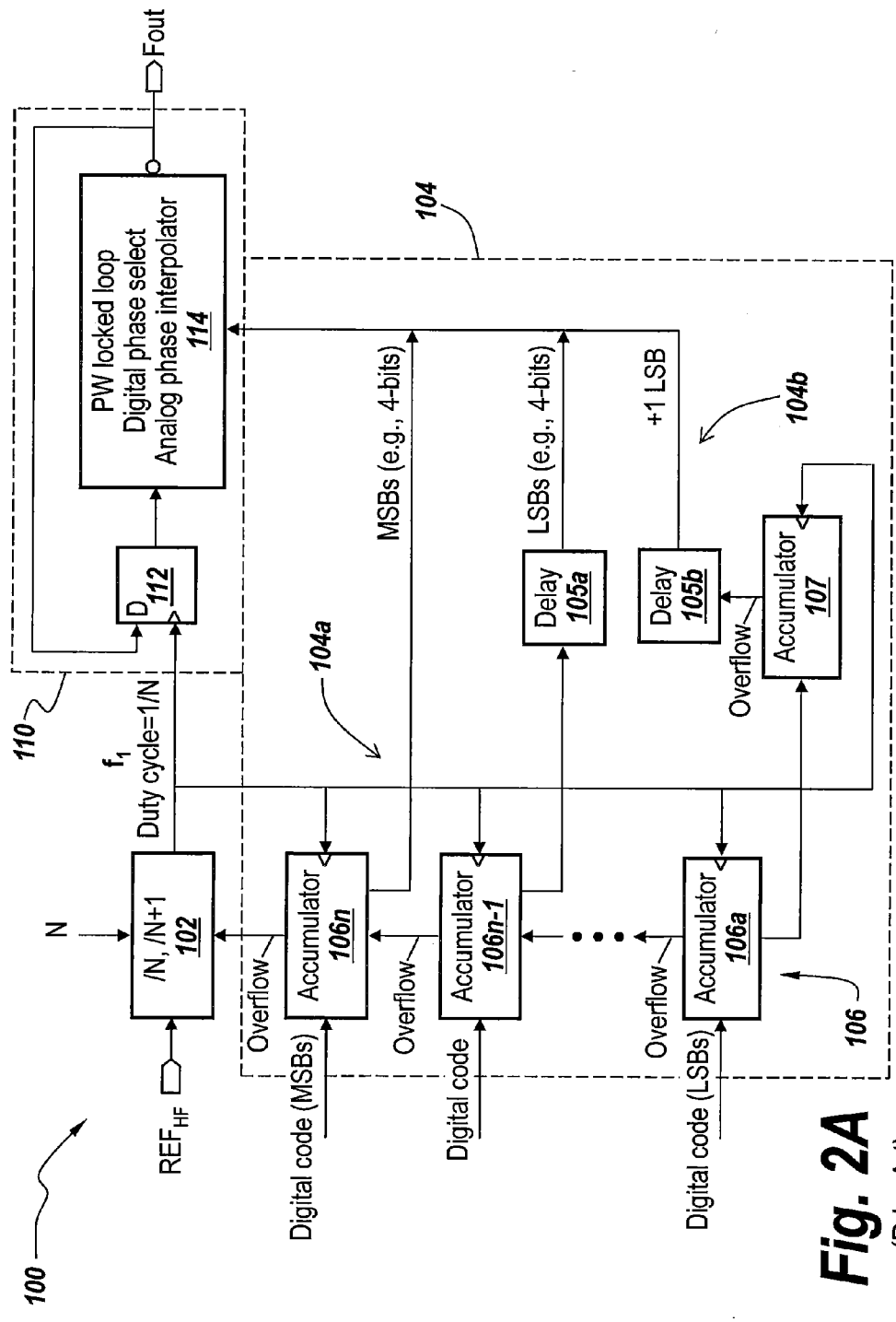
FIG. 2A is a block diagram of a fractional-N divider circuit containing a segmented accumulator, according to the prior art.
Figure 2B:
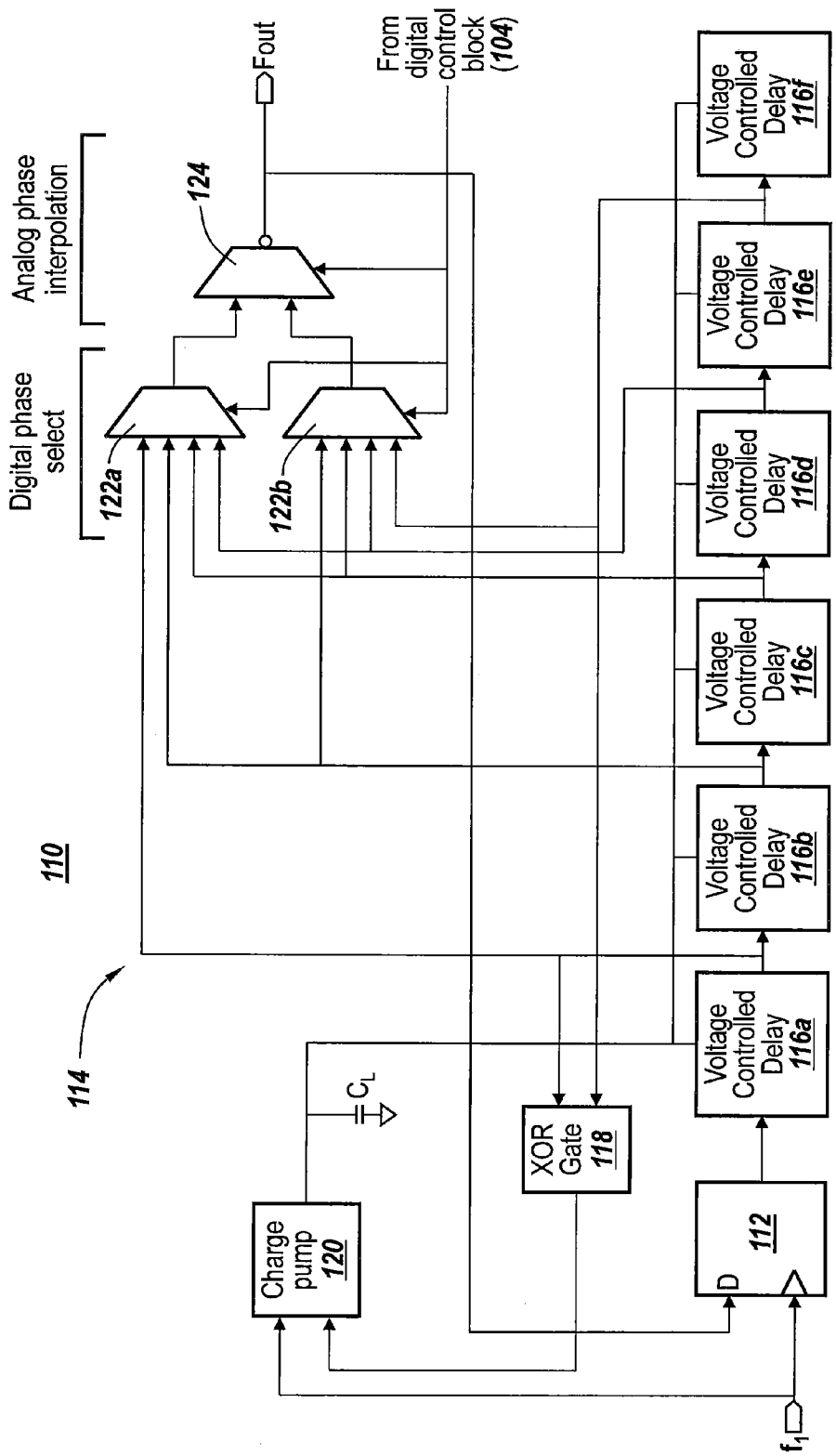
FIG. 2B is a block diagram of an embodiment of the phase correction circuit of FIG. 2A.
Figure 3:
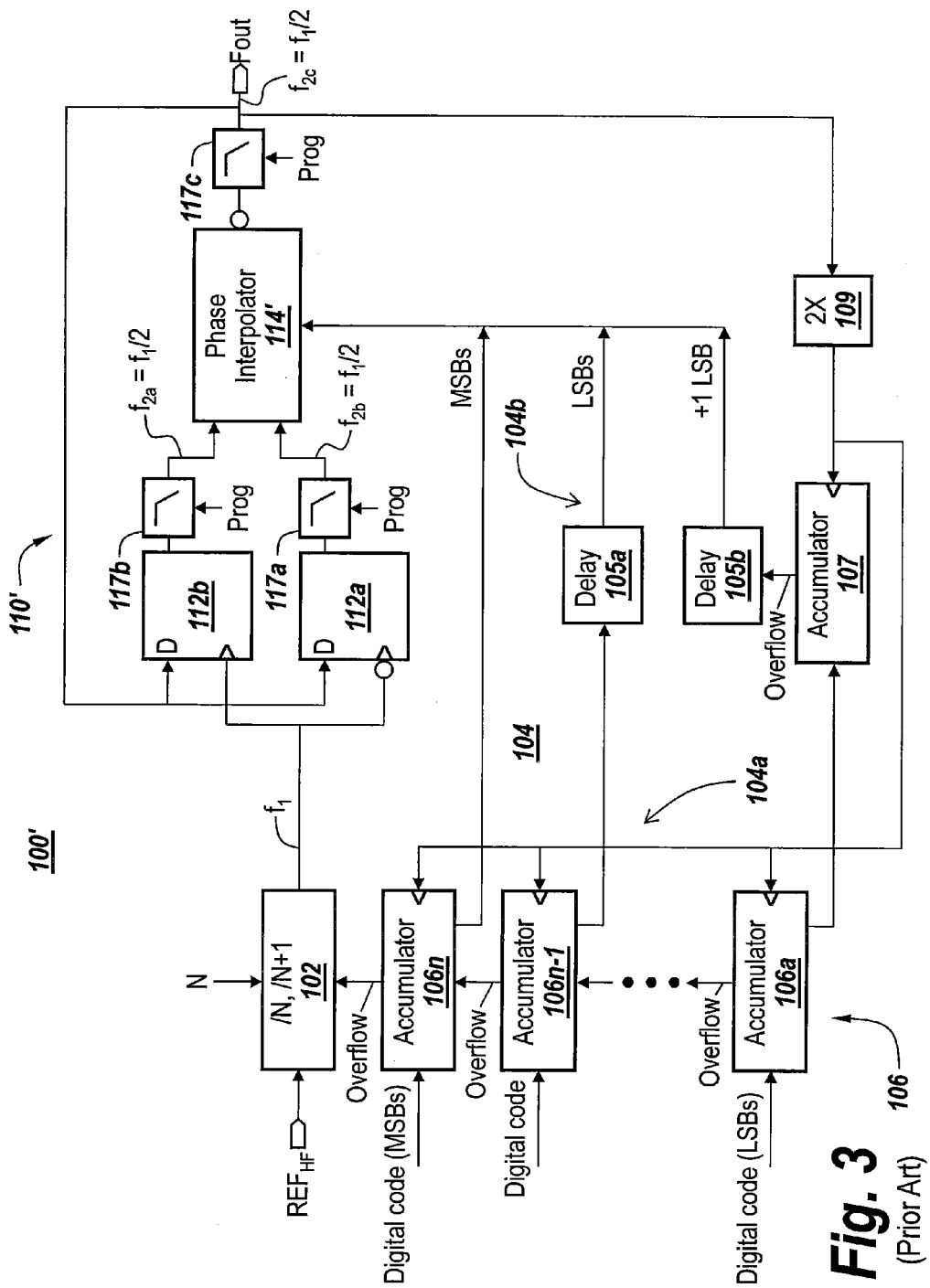
FIG. 3 is a block diagram of a fractional-N divider circuit containing a segmented accumulator, according to the prior art.
Figure 4:
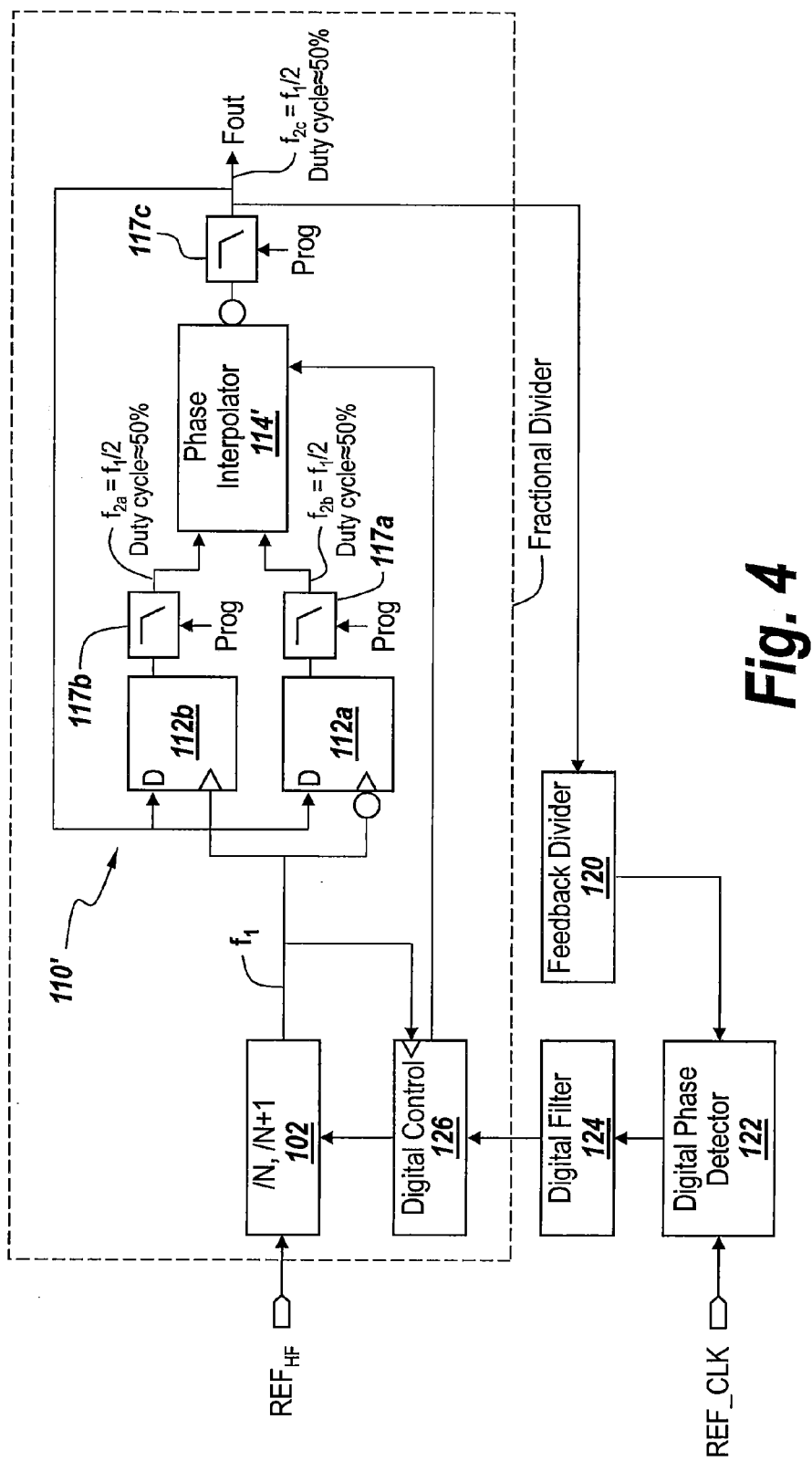
FIG. 4 is a block diagram of a PLL integrated circuit, which adds components to a conventional fractional divider.

As illustrated by FIG. 4, a fractional divider may be utilized in a forward signal path of a phase-locked loop (PLL) integrated circuit, by adding a feedback signal path utilizing a digital phase detector 122, a digital loop filter 124 and a feedback divider 120, connected as illustrated. This embodiment of a fractional divider is illustrated as including a digital control circuit 126, a multi-modulus divider (MMD) 102 and a phase correction circuit 110'. The operations of these components of the fractional divider are more fully described hereinabove with respect to FIGS. 2A-2B and 3 and in the aforementioned commonly assigned '587 patent, which is hereby incorporated herein by reference. One potential limitation in the performance of the fractional divider based PLL of FIG. 4 stems from the fact that the potentially high fidelity PLL analog output signal (Fout) may be fed back to produce a lower frequency and relatively noise free (e.g., jitter free) feedback signal to an input of the digital phase detector 122, which performs phase comparison operations relative to REF_CLK. As will be understood by those skilled in the art, a less active signal(s) at the input(s) of the digital phase detector 122 can increase a likelihood of "dead-zone" operation therein, which can limit performance of the PLL.

Figure 5A:
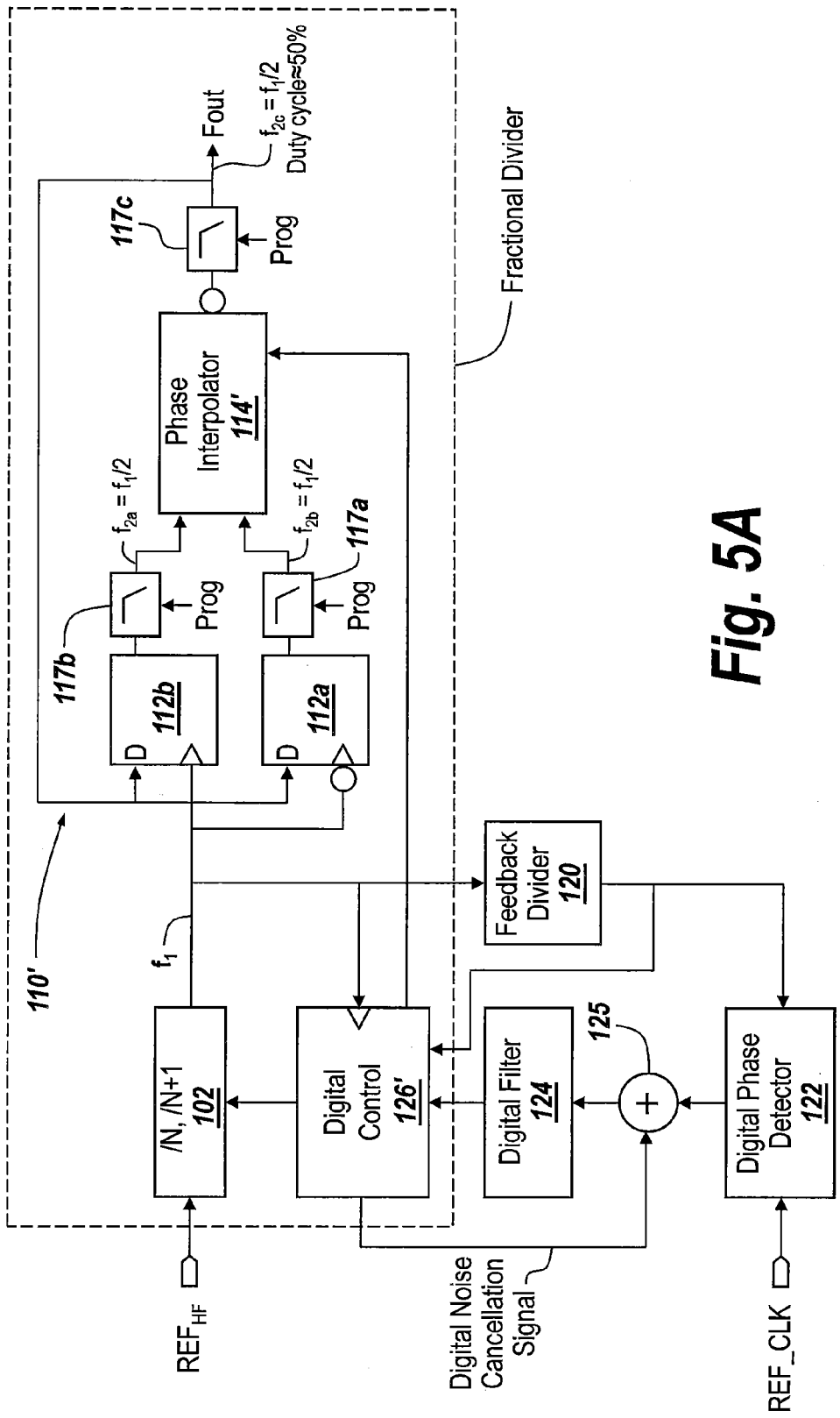
FIG. 5A is a block diagram of a PLL integrated circuit with digital noise cancellation, according to an embodiment of the invention.

Referring now to FIG. 5A, a fractional divider based phase-locked loop (FDPLL) according to some embodiments of the invention is illustrated as including a modified digital control circuit 126' within a fractional divider, and a feedback circuit including a feedback divider 120, a digital phase detector 122, a digital adder 125 and a digital loop filter 124, connected as illustrated. As shown, the digital adder 125 operates to combine a digital noise cancellation signal generated by the digital control circuit 126' with a signal generated at an output of the digital phase detector 122.

As will now be described with respect to FIGS. 5A-5B, a fractional divider based phase-locked loop (FDPLL) according to an embodiment of the invention is less susceptible to "dead-zone" operation within the digital phase detector 122 and may have higher resolution and better linearity compared to the PLL of FIG. 4. To achieve this enhanced level of operation, a more "active" signal is provided as feedback to an input of the digital phase detector 122. This more active input signal is derived from an output signal ($f_1$) generated by the multi-modulus divider (MMD) 102, which is passed through a feedback frequency divider 120 to a first input of the digital phase detector 122, as illustrated. This higher degree of "activity" in the feedback signal provided to the digital phase detector 122 is a consequence of a higher level of non-random deterministic "noise" (e.g., jitter) in the MMD output signal ($f_1$), which is created as a direct consequence of the modulus control (i.e., /N versus /N+1) provided by the digital control circuit 126'. Because this modulus control results in deterministic "noise" (e.g., known jitter) in the MMD output signal ($f_1$), it can be digitally removed from an output of the digital phase detector 122, as described more fully hereinbelow.

In FIG. 5A, the feedback divider 120 within the feedback circuit generates a reduced frequency output signal in response the MMD output signal ($f_1$). This feedback divider 120, which may be an integer or fractional divider, also provides the reduced frequency output signal as a synchronizing signal to the digital control circuit 126', as explained more fully hereinbelow with respect to FIG. 5B. Using known operations, the digital phase detector 122 generates a phase detector output signal in response to determining a phase difference between a reference clock (REF_CLK) and the reduced frequency output signal generated by the feedback divider 120. The phase detector output signal is provided to the digital adder 125 and modified by the noise cancellation signal generated by the digital control circuit 126', as shown. The digital loop filter 124 receives the modified phase detector output signal and performs a digital filtering operation using known techniques. An output signal generated by the digital loop filter 124 is provided as an input data signal to the digital control circuit 126'. As shown by FIG. 5B, the multi-bit signal generated by the digital loop filter 124 includes integer and fractional components, which are provided to the digital adder 127 and accumulator 130, respectively. Using known techniques, such as those described in the aforementioned '587 patent, the digital adder 127 combines the integer component of the output signal generated by the digital loop filter 124 with an overflow signal generated by the accumulator 130. As will be understood by those skilled in the art, the accumulator is synchronized to the MMD output signal ($f_1$).

Figure 5B:
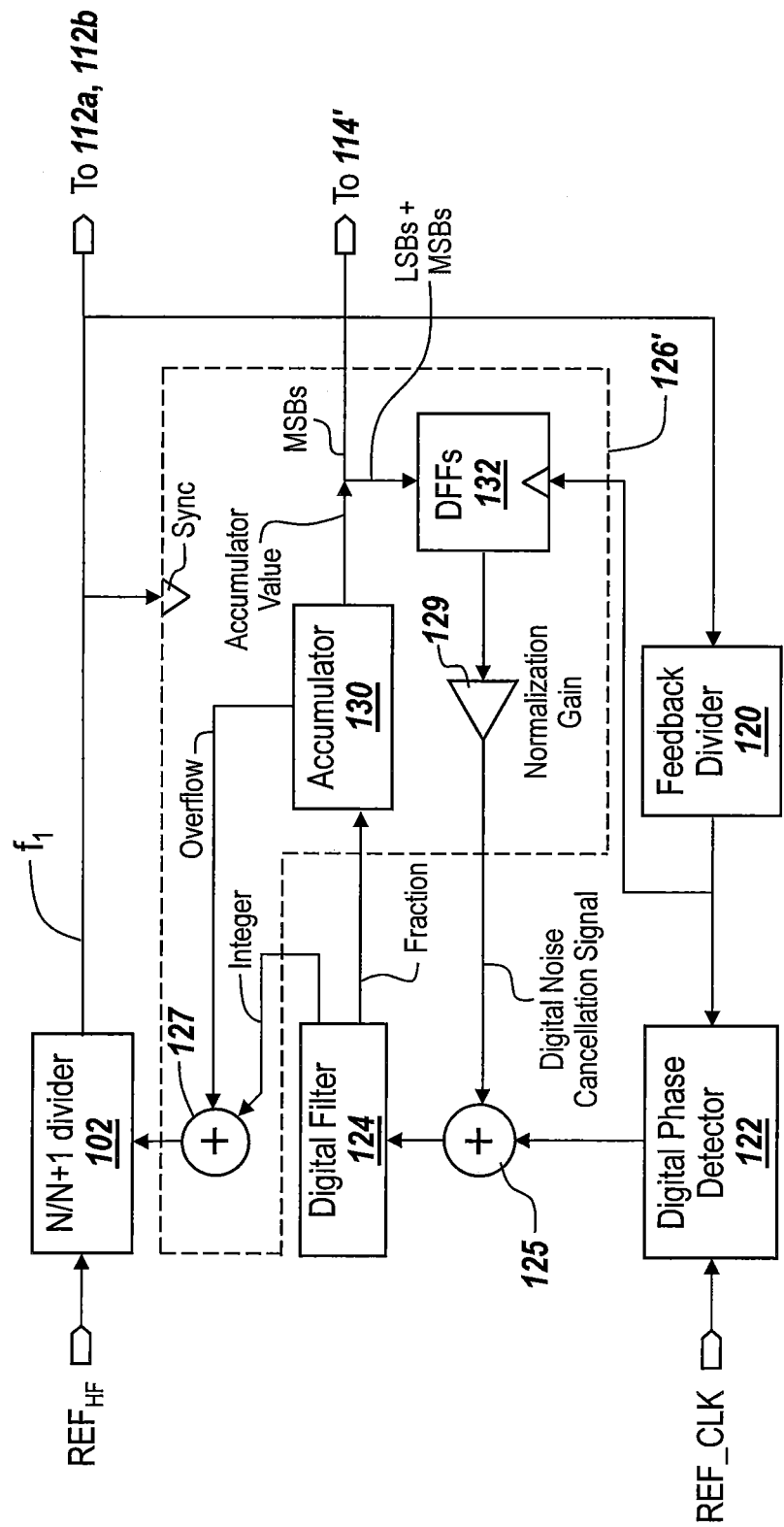
FIG. 5B is a block diagram of a portion of the PLL integrated circuit of FIG. 5A.

As further shown by FIG. 5B, the most significant bits (e.g., 8 MSBs) of the accumulator value signal generated by the accumulator 130 are provided to control operation of the analog phase interpolator 114' within the fractional divider. In contrast, the most significant bits and least significant bits (LSBs) of the accumulator value signal are provided to an M-bit register 132, which may be configured from D-type flip-flops (DFFs) that are synchronized to the reduced frequency output signal generated by the feedback divider 120. Based on calibration operations during start-up, etc., a programmable non-unity digital scaling operation (e.g., normalization) may be performed on the M-bit output of the register 132 to thereby yield a digital noise cancellation signal, which is provided to the digital adder 125. Although not wishing to be bound by any theory, an accumulator value calculated within a circuit that controls operation of the MMD 102 and analog phase interpolator 114' can be used to provide digital noise cancellation in the PLL feedback circuit. This noise cancellation, as described herein, can have higher resolution and better linearity compared with "analog" noise cancellation, which can be achieved by feeding back the PLL output signal, as shown by FIG. 4.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase-locked loop (PLL) integrated circuit, comprising:
a fractional divider configured to generate a periodic PLL output signal in response to a first periodic reference signal, said fractional divider comprising a digital control circuit responsive to a digital control input signal and a multi-modulus divider (MMD) responsive to the first periodic reference signal and a first digital control output signal generated by said digital control circuit;
a feedback divider (FD) configured to generate a periodic FD output signal in response to a periodic MMD output signal generated by the MMD;
a digital phase detector (PD) configured to generate a PD output signal in response to the FD output signal and a second periodic reference signal, which are received at respective first and second inputs thereof; and
a digital loop filter configured to generate the digital control input signal in response to the phase detector output signal as modified by a noise cancellation signal that is generated by said digital control circuit to at least partially compensate for non-random deterministic noise in the MMD output signal.

2. The PLL integrated circuit of claim 1, wherein changes in the first digital control output signal are synchronized to the MMD output signal whereas changes in the noise cancellation signal are synchronized to the FD output signal; and wherein a frequency of the MMD output signal is greater than a frequency of the FD output signal.

3. The PLL integrated circuit of claim 2, wherein said fractional divider comprises an analog phase interpolator responsive to a second digital control output signal generated by said digital control circuit.

4. The PLL integrated circuit of claim 3, wherein changes in the second digital control output signal are synchronized to the MMD output signal.

5. The PLL integrated circuit of claim 4, wherein said digital control circuit comprises a register having a data input responsive to the second digital control output signal; and wherein the noise cancellation signal is derived from a signal generated at an output of the register.

6. The PLL integrated circuit of claim 5, wherein the register utilizes the FD output signal as a clock signal that synchronizes operation of the register.

7. A phase-locked loop (PLL) integrated circuit, comprising:
- a fractional divider configured to generate a periodic PLL output signal in response to a first periodic reference signal, said fractional divider comprising a digital control circuit responsive to a digital control input signal and a multi-modulus divider (MMD) responsive to the first periodic reference signal and a first digital control output signal generated by said digital control circuit;
- a feedback divider (FD) configured to generate a periodic FD output signal by performing integer or fractional frequency division on a periodic MMD output signal generated by the MMD, which is a noisier signal relative to the PLL output signal;
- a digital phase detector (PD) configured to generate a PD output signal in response to the FD output signal and a second periodic reference signal, which are received at respective first and second inputs thereof; and
- a digital loop filter configured to generate the digital control input signal in response to the phase detector output signal as modified by a noise cancellation signal that at least partially corrects for non-random deterministic noise in the MMD output signal.

8. The PLL integrated circuit of 7, wherein said fractional divider further comprises an analog phase interpolator responsive to a second digital control output signal generated by said digital control circuit; wherein said digital control circuit comprises a register having a data input responsive to the second digital control output signal; and wherein the noise cancellation signal is derived from a signal generated at an output of the register.

9. The PLL integrated circuit of claim 8, wherein the noise cancellation signal is an M-bit signal that is synchronized with the FD output signal and the second digital control output signal is an N-bit signal, where M and N are positive integers greater than four and M is greater than N.

10. The PLL integrated circuit of 7, wherein said fractional divider further comprises an analog phase interpolator responsive to a second digital control output signal generated by said digital control circuit; wherein said digital control circuit comprises a register having a data input responsive to the second digital control output signal; and wherein the noise cancellation signal is derived from a signal generated at an output of the register.

11. The PLL integrated circuit of claim 10, wherein the changes in the second digital control output signal are synchronized to the MMD output signal.

12. The PLL integrated circuit of claim 11, wherein said digital control circuit comprises an accumulator; and wherein the second digital control output signal is generated at an output of the accumulator.

13. The PLL integrated circuit of claim 10, wherein the register utilizes the FD output signal as a clock signal that synchronizes operation of the register.

14. A phase-locked loop (PLL) integrated circuit, comprising:
- a fractional divider configured to generate a PLL output signal in response to a reference signal, said fractional divider comprising a digital control circuit and a multi-modulus divider (MMD) configured to generate a MMD output signal in response to the reference signal and a first digital control output signal generated by the digital control circuit, said MMD output signal having non-random deterministic jitter therein caused by changes in the first digital control output signal during operation of the PLL; and
- a feedback circuit electrically coupled to the MMD and the digital control circuit, said feedback circuit configured to synchronize timing of a digital noise cancellation signal generated by the digital control circuit, said digital noise cancellation signal having a value that when combined with a first feedback signal in the feedback circuit operates to reduce phase jitter in the PLL output signal relative to an otherwise equivalent PLL integrated circuit operating in absence of the digital noise cancellation signal.

15. The PLL integrated circuit of claim 14, wherein said fractional divider comprises an analog phase interpolator responsive to a second digital control output signal generated by said digital control circuit; and wherein the combination of the digital noise cancellation signal with the first feedback signal influences a value of the second digital control output signal provided to the analog phase interpolator.

16. The PLL integrated circuit of claim 15, wherein said feedback circuit comprises a digital phase detector, which generates the first feedback signal.

17. The PLL integrated circuit of claim 15, wherein said feedback circuit comprises a feedback divider having an input responsive to the MMD output signal.

18. The PLL integrated circuit of claim 15, wherein the digital control circuit comprises an accumulator configured to generate an M-bit accumulator output signal; wherein the digital noise cancellation signal is derived from the M-bit accumulator output signal; and wherein the second digital control output signal is derived from N-bits of the M-bit accumulator output signal, where M and N are positive integers and M is greater than N.

19. The PLL integrated circuit of claim 14, wherein said feedback circuit comprises a feedback divider having an input responsive to the MMD output signal.

20. The PLL integrated circuit of claim 14, wherein said feedback circuit comprises a digital adder configured to combine the digital noise cancellation signal with the first feedback signal.

\* \* \* \* \*